United States Patent

Hauquier et al.

[11] Patent Number: 5,663,031
[45] Date of Patent: Sep. 2, 1997

[54] DIAZO BASED IMAGING ELEMENT HAVING IMPROVED RESISTANCE AGAINST PHYSICAL DAMAGE

[75] Inventors: Guido Hauquier, Nijlen; Joan Vermeersch, Deinze; Eric Verschueren, Merksplas; Dirk Kokkelenberg, St. Niklaas; Willem Cortens, Booischot, all of Belgium

[73] Assignee: Agfa-Gevaert, N.V., Mortsel, Belgium

[21] Appl. No.: 593,354

[22] Filed: Jan. 29, 1996

[30] Foreign Application Priority Data

Feb. 15, 1995 [EP] European Pat. Off. ............ 95200360

[51] Int. Cl.⁶ .................................................. G03F 7/11
[52] U.S. Cl. ............................ 430/159; 430/157; 430/160; 430/175; 430/176
[58] Field of Search .................................. 430/159, 157, 430/160, 175, 176, 272.1, 320

[56] References Cited

U.S. PATENT DOCUMENTS 4,970,133  11/1990  Vermeersch et al. .............. 430/175
5,445,912   8/1995  Hauquier et al. .................. 430/157
5,462,833  10/1995  Hauquier et al. .................. 430/159

Primary Examiner—John S. Chu
Attorney, Agent, or Firm—Breiner & Breiner

[57] ABSTRACT

The present invention provides an imaging element comprising on a support in the order given a coated composition of at least two hydrophilic layers being in water permeable contact with each other and each containing a hydrophilic (co)polymer or (co)polymer mixture and having been hardened with a hydrolyzed tetraalkyl orthosilicate and a light sensitive layer containing a diazo resin or a diazonium salt characterized in that the ratio by weight in the top layer of said package of said hydrophilic (co)polymer or (co)polymer mixture versus said hydrolyzed tetraalkyl orthosilicate (expressed as silicon dioxide) is at least 1.1 and the ratio by weight in an underlying layer of said package of said hydrophilic (co)polymer or (co)polymer mixture versus said hydrolyzed tetraalkyl orthosilicate (expressed as silicon dioxide) is not higher than 0.9.

9 Claims, No Drawings ic (expressed as silicon dioxide) is at least 1.1 and the ratio by weight in an underlying layer of said package of the hydrophilic (co)polymer or (co)polymer mixture versus the hydrolysed tetraalkyl orthosilicate (expressed as silicon dioxide) is not higher than 0.9 and a light sensitive layer containing a diazo resin or a diazonium salt, the obtained imaging element in accordance with the present invention has an improved resistance against physical damage. This results in an improvement of the lithographic properties such as the prevention of printing spots and even downright fog in the non-printing areas of said printing plates.

DIAZO BASED IMAGING ELEMENT HAVING IMPROVED RESISTANCE AGAINST PHYSICAL DAMAGE

FIELD OF THE INVENTION

The present invention relates to a diazo sensitized imaging element which is developable by plain water to a lithographic printing plate.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers.

Particularly diazo-sensitized systems are widely used. These systems have been extensively reviewed by Kosar J. in "Light-Sensitive Systems", Wiley, New York, 1965, Chapter 7. A generally used negative-working diazo-sensitized system is based on the capability of diazo compounds to harden a polymer when exposed to ultraviolet and blue radiation. Diazo compounds which have been used for the preparation of lithographic printing plates based on their hardening properties are e.g. diazonium salts whose photolysis products can harden polymers (natural colloids or synthetic resins) directly and diazonium polymers. Although polymers containing diazonium groups have a large structure they remain water soluble owing to the presence of the ionic diazonium groups. When these groups are destroyed by exposure to light an insoluble resin is formed. Particularly useful diazonium polymers are the condensation products of a carbonyl compound, e.g. an aldehyde, such as formaldehyde, with a diazonium salt of e.g. a p-aminodiphenylamine. These condensation products are usually designated diazo resins. In these systems a polymeric binder is optionally added to the diazo resin coating.

Several types of supports can be used for the manufacturing of a diazo-sensitized lithographic printing plate. Common supports are metal supports like Al or Zn, polyester film supports and paper bases. These supports, if not sufficient hydrophilic by themselves, are first coated with a hydrophilic layer to form the hydrophilic background of the printing plate and a top layer containing the diazo compound is then applied (see for example DE-P-L1900469, DE-P-2030634 and U.S. Pat. No. 3,971,660).

It is known to use as hydrophilic layer in these systems a layer containing polyvinyl alcohol and hydrolyzed tetraethyl orthosilicate and preferably also silicium dioxide and/or titanium dioxide as described in e.g. GB-P-1419512, FR-P-2300354, U.S. Pat. No. 3,971,660 and 4,284,705. This hydrophilic layer is overcoated with a light-sensitive layer containing a diazonium salt or a diazo resin in a polymeric binder.

Upon image-wise exposure of the light-sensitive layer the exposed image areas become water insoluble and the unexposed areas remain water soluble. The plate is then developed with water to remove the diazonium salt or diazo resin in the unexposed areas. Such development may take place by means of plain water as disclosed in e.g. EP-A-450199 and EP-A-601240.

It has however been found that diazo based imaging elements comprising as hydrophilic layer a layer containing polyvinyl alcohol and hydrolyzed tetraethyl orthosilicate as disclosed in e.g. EP-A-450199, EP-A-60124, and U.S. Pat. No. 3,971,660 are prone to physical damage during transport and handling resulting in printing spots and even to downright fog in the non-printing areas of said printing plates.

SUMMARY OF THE INVENTION

It is an object of the present invention to provide a diazo based imaging element for producing a lithographic printing plate said diazo based imaging element having an improved resistance against physical damage in order to improve the printing properties of said lithographic printing plate.

Other objects will become apparent from the description hereinafter.

According to the present invention an imaging element comprising on a support in the order given a coated composition of at least two hydrophilic layers being in water permeable contact with each other and each containing a hydrophilic (co)polymer or (co)polymer mixture and having been hardened with a hydrolysed tetraalkyl orthosilicate and a light sensitive layer containing a diazo resin or a diazonium salt characterized in that the ratio by weight in the top layer of said package of said hydrophilic (co)polymer or (co)polymer mixture versus said hydrolysed tetraalkyl orthosilicate (expressed as silicon dioxide) is at least 1.1 and the ratio by weight in an underlying layer of said package of said hydrophilic (co)polymer or (co)polymer mixture versus said hydrolysed tetraalkyl orthosilicate (expressed as silicon dioxide) is not higher than 0.9.

According to the present invention there is provided a method for obtaining a lithographic printing plate comprising the steps of image-wise exposing an imaging element as defined above and subsequently removing the light sensitive layer in the non-exposed or insufficiently exposed areas of said imaging element by means of rinsing or washing said imaging element with an aqueous liquid.

DETAILED DESCRIPTION

By applying on a support a coated composition of at least two hydrophilic layers wherein the ratio by weight in the top layer of said package of said hydrophilic (co)polymer or (co)polymer mixture versus said hydrolysed tetraalkyl orthosilicate (expressed as silicon dioxide) is at least 1.1 and the ratio by weight in an underlying layer of said package of the hydrophilic (co)polymer or (co)polymer mixture versus the hydrolysed tetraalkyl orthosilicate (expressed as silicon dioxide) is not higher than 0.9 and a light sensitive layer containing a diazo resin or a diazonium salt, the obtained imaging element in accordance with the present invention has an improved resistance against physical damage. This results in an improvement of the lithographic properties such as the prevention of printing spots and even downright fog in the non-printing areas of said printing plates.

Preferably the ratio by weight in the top layer of said coated composition of the hydrophilic (co)polymer or (co)polymer mixture versus the hydrolysed tetraalkyl orthosilicate (expressed as silicon dioxide) is at least 1.5, more preferably at least 2. An upper limit of said ratio is for practical reasons preferably not higher than 5.

Also preferably the ratio by weight in an underlying layer of said package of the hydrophilic (co)polymer or (co) polymer mixture versus the hydrolysed tetraalkyl orthosilicate (expressed as silicon dioxide) is not higher than 0.75, more preferably not higher than 0.65. A lower limit of said ratio is for practical reasons preferably not lower than 0.2, more preferably not lower than 0.35.

The dry thickness of the coated composition of at least two hydrophilic layers in a material according to this invention may vary in the range of 0.2 to 25 um and is preferably 1 to 10 um. Said coated composition of at least two hydrophilic layers may comprise hydrophilic (co)polymer or (co)polymer mixture in an amount from 0.2 g/m$^2$ to 20 g/m$^2$, more preferably from 0.5 g/m$^2$ to 6 g/m$^2$.

The ratio of the thickness of the top hydrophilic layer of said coated composition to the thickness of the underlying layer of said package may vary from 0.1 to 10, more preferably from 0.25 to 4. The amount of hydrophilic (co)polymer or (co)polymer mixture in the top layer of said coated composition may vary from 0.1 g/m$^2$ to 18 g/m$^2$, more preferably from 0.4 g/m$^2$ to 5 g/m$^2$. The amount of hydrophilic (co)polymer or (co)polymer mixture in the underlying layer of said coated composition may vary from 0.01 g/m$^2$ to 7.5 g/m$^2$, more preferably from 0.05 g/m$^2$ to 1 g/m$^2$.

The top hydrophilic layer of the coated composition is in water permeable contact with the underlying hydrophilic layer of the coated composition. Layers being in water permeable contact with each other are layers that are contiguous to each other or only separated from each other by (a) water permeable layer(s). The nature of a waterpermeable layer is such that it does not substantially inhibit or restrain the diffusion of water or of compounds contained in an aqueous solution.

The coated composition of at least two hydrophilic layers in water permeable contact with each other preferably consist of only those two layers. However it may contain hydrophilic layers containing a hydrophilic (co)polymer or (co)polymer mixture and having been hardened with a hydrolysed tetraalkyl orthosilicate between said top layer and said underlying layer or it may contain hydrophilic layers containing a hydrophilic (co)polymer or (co)polymer mixture and having been hardened with a hydrolysed tetraalkyl orthosilicate under said underlying layer. When said package contains more than two hydrophilic layers, preferably the ratio by weight in said layers of said coated composition of the hydrophilic (co) polymer or (co) polymer mixture versus the hydrolysed tetraalkyl orthosilicate (expressed as silicon dioxide) gradually decreases from the top layer to the under layer.

As hydrophilic (co)polymers in the hydrophilic layer of an imaging element in connection with the present invention one may use, for example, homopolymers and copolymers of vinyl alcohol, acrylamide, methylol acrylamide, methylol methacrylamide, hydroxyethyl acrylate or hydroxyethyl methacrylate. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight. Most preferably polyvinyl alcohol hydrolyzed to at least an extent of 80 percent by weight is used in the hydrophilic layers in connection with the present invention.

Examples of hydrolyzed tetraalkyl orthosilicate crosslinking agents are hydrolyzed tetraethyl orthosilicate and hydrolyzed tetramethyl orthosilicate.

The hydrophilic layers (or possibly only one of them) preferably also contain substances that increase the mechanical strength and the porosity of the layers. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the package of hydrophilic layers is given a uniform rough texture consisting of microscopic hills and valleys, which serve as storage places for water in background areas.

The light sensitive layer of an imaging element in connection with the present invention preferably contains a diazonium salt or diazo resin and a hydrophilic binder. A suitable hydrophilic binder is for example pullulan.

Pullulan is a polysacharide that is produced by microorganisms of the Aureobasidium pullulans type (Pullularia pullulans) and that contains maltotriose repeating units connected by a α-1,6 glycosidic bond. Pullulan is generally produced on industrial scale by fermentation of partially hydrolysed starch or by bacterial fermentation of sucrose. Pullulan is commmercially available from e.g. Shodex, Pharmacosmos.

Alternatively the light sensitive layer may contain polyvinylacetate hydrolysed to an extent of at least 95% by weight as a binder.

Preferably the light sensitive layer further includes a cationic fluor containing surfactant, preferably a perfluorinated surfactant and more preferably a perfluorinated ammonium surfactant. Typical examples of perfluorinated ammonium surfactants are:

n.C$_8$F$_{17}$SO$_2$NH—(CH$_2$)$_3$N$^+$(CH$_3$)$_3$I$^-$ (Fluorad FC 135 from 3M)

n.C$_9$F$_{19}$SO$_2$NH—(CH$_2$)$_4$N$^+$(CH$_3$)$_3$Br$^-$ n.C$_7$F$_{15}$CONH—(CH$_2$)$_3$N$^+$(CH$_3$)$_3$I$^-$ (n.C$_8$F$_{17}$COO—(CH$_2$)$_4$)$_2$N$^+$(CH$_3$)$_2$I$^-$

Examples of low-molecular weight diazonium salt for use in the present invention include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde.

Examples of diazo resins useful in the present invention include condensation products of an aromatic diazonium salt as the light-sensitive substance. Such condensation products are known and are described, for example, in German Pat. no. 1214086. They are in general prepared by condensation of a polynuclear aromatic diazonium compound, preferably of substituted or unsubstituted diphenylamine-4-diazonium salts, with active carbonyl compounds, preferably formaldehyde, in a strongly acid medium.

The light sensitive layer according to the present invention preferably also contains dispersed water-insoluble polymers. Said aqueous dispersion of water insoluble polymer is preferably cationic or nonionic either e.g. as a result of an emulsifier or by having the cationic or nonionic group linked to the polymer. The water insoluble polymer is preferably a solid particulate having a size in the range of about 100 Angstroms to 1 micron in diameter and does not form a film below 30° C. In general, any polymer which carries a cationic or nonionic group or which can be formulated into an emulsion using a cationic or nonionic emulsifier can be employed in the present invention. Suitable polymers include homopolymers and copolymers of styrene, methylacrylate, ethylacrylate, butylacrylate, methylmethacrylate, ethylmethacrylate, butyl methacrylate, vinyl acetate, vinyl chloride, vinylidene chloride, butadiene, methyl styrene, vinyl toluene, dimethylaminoethyl acrylate, acrylic acid, methacrylic acid, isoprene, chloroprene, malei anhydride, ethylene glycol acrylates such as polyethylene glycol acrylate, halogenated vinyl aromatics such as chlorostyrene and bromostyrene, methylvinyl ether, vinyl pyrrolidone, polyurethane and the like.

Among the cationic and nonionic emulsifiers which can be used in the present invention are: ammonium salts of substituted amines containing alkyl and/or aryl groups attached to the nitrogen, alkyl or aryl sulfonium salts, alkyl and alkyl-aryl polyethers, cationic or nonionic fluorosurfactants and polyoles.

The thickness of the light-sensitive layer in the material of this invention may vary in the range of 0.1 to 10 µm and is preferably between 0.5 and 2.5 µm.

Suitable supports that can be used in an imaging element in accordance with the present invention are e.g. photographic film bases e.g. substrated polyethylene terephthalate film, cellulose acetate film, plastics having a metal layer or deposit thereon, and polyolefin (e.g. polyethylene) coated paper, the polyolefin surface of which may have been subjected to a corona discharge to improve the adherence of a hydrophilic layer.

One or more subbing layers may be coated between the support and the coated composition of at least two hydrophilic layers and contiguous to the under hydrophilic layer for use in accordance with the present invention in order to get an improved adhesion between these two layers.

A preferred subbing layer for use in connection with the present invention is a subbing layer comprising a hydrophilic binder and silica.

As hydrophilic binder in said subbing layer usually a protein, preferably gelatin may be used. Gelatin can, however, be replaced in part or integrally by synthetic, semi-synthetic, or natural polymers. Synthetic substitutes for gelatin are e-g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

A preferred silica in said subbing layer is a siliciumdioxide of the anionic type. The colloidal silica preferably has a surface area of at least 100 m² per gram, more preferably a surface area of at least 300 m² per gram.

The surface area of the colloidal silica is determined according to the BET-value method described by S. Brunauer, P. H. Emmett and E. Teller, J. Amer. Chem. Soc. 60, 309–312 (1938).

The silica dispersion may also contains other substances, e.g. aluminum salts, stabilizing agents, biocides etc.

Such types of silica are sold under the name KIESELSOL 100, KIESELSOL 300 and KIESELSOL 500 (KIESELSOL is a registered trade name of Farbenfabriken Bayer AG, Leverkusen, West-Germany whereby the number indicates the surface area in m² per gram).

The weight ratio of the hydrophilic binder to silica in the subbing layer is preferably less than 1. The lower limit is not very important but is preferably at least 0.2. The weight ratio of the hydrophilic binder to silica is more preferably between 0.25 and 0.5.

The coverage of said subbing layer is preferably more than 200 mg per m² but less than 750 mg per m², more preferably between 250 mg per m² and 500 mg per m².

The coating of the above defined subbing layer composition preferably proceeds from an aqueous colloidal dispersion optionally in the presence of a surface-active agent.

According to a preferred embodiment in connection with the present invention there is provided an intermediate layer of an organic compound having cationic groups between the top hydrophilic layer of said coated composition of at least two hydrophilic layers and the light sensitive layer. As a consequence the development by plain water of such a diazo based imaging element is improved.

Organic compounds having cationic groups for use in an intermediate layer are preferably hydrophilic and may be low moleculair weight compounds but are preferably polymers. Preferred compounds are those having one or more ammonium groups or amino groups that can be converted to ammonium groups in an acidic medium. An especially preferred type of cationic compounds are polysacharides modified with one or more groups containing an ammonium or amino group.

Most preferred organic compounds having cationic groups are dextrans or pullulan wherein at least some of the hydroxy groups of the dextran or pullulan has been modified into one or more of the following groups:

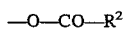

wherein $R^1$ represents an organic residue containing an amino or ammonium group, e.g. an amine substituted alkyl, an amine substituted alkylaryl etc.

$R^2$ has one of the significances given for $R^1$ or stands for —$OR^3$ or —$N(R^4)R^5$, wherein $R^3$ has one of the significances given for $R^1$ and each of $R^4$ and $R^5$ which may be the same or different have one of the significances given for $R^1$.

Examples of dextrans or pullulan that can be used in accordance with the present invention are dextrans or pullulan wherein some of the hydroxyl groups have been modified in one of the groups shown in table 1.

TABLE 1

| no. | modified group |
|-----|----------------|
| 1 | —O—$CH_2$—$CH_2$—$NH_2$ |
| 2 | —O—CO—NH—$CH_2$—$CH_2$—$NH_2$ |
| 3 | —O—CO—NH—$CH_2$—$CH_2$—N($CH_2$—$CH_2$—$NH_2$)$_2$ |
| 4 | —O—$CH_2$—$CH_2$—NH—$CH_2$—$CH_2$—$NH_2$ |
| 5 | —O—$CH_2$—$CH_2$—NH—$CH_2$—CHOH—$CH_2$—$N^+(CH_3)_3$ $Cl^-$ |
| 6 | —O—($CH_2$—$CH_2$—O)$_n$—$CH_2$—$CH_2$—$NH_2$ wherein n represents an integer from 1 to 50 |
| 7 | —O—CO—NH—$CH_2$—$CH_2$—NH—$CH_2$—CHOH—$CH_2$—$N^+(CH_3)_3$ $Cl^-$ |
| 8 | —O—$CH_2$—$CH_2$—N($CH_2$—$CH_3$)$_2$.HCl |
| 9 | —O—$CH_2$—$CH_2$—N($CH_2$—$CH_2$—$NH_2$)$_2$ |
| 10 | —O—CONH—$CH_2$—$CH_2$—N($CH_2$—$CH_2$—$NH_2$)$_2$ |
| 11 | —O—CONH—($CH_2$—$CH_2$—O)$_n$—$CH_2$—$CH_2$—$NH_2$ |

The modified dextrans or pullulan can be prepared by a reaction of a dextran with e.g. alkylating agents, chloroformates, acid halides, carboxylic acids etc.

An intermediate layer containing the organic compound having one or more cationic groups is preferably provided in an amount of 5 to 500 mg/m$^2$ and more preferably in an amount of 10 to 200 mg/m$^2$.

The imaging element in connection with the present invention advantageously contains water-soluble dyes such as rhodamines, sudan blue, methylen blue, eosin or trifenylmethane dyes such as crystal violet, victoria pure blue, malachite green, methylviolet and fuchsin or dye pigments. These colorants may be incorporated in the light sensitive layer and/or hardened hydrophilic layers.

To obtain a lithographic printing plate from an imaging element according to the invention said imaging element is image-wise exposed and subsequently rinsed or washed with an aqueous liquid, preferably plain water to remove diazo resin or diazonium salts in the non-exposed or insufficiently exposed parts of the imaging element.

The exposure of the imaging element used in the present invention advantageously proceeds with ultraviolet light optionally in combination with blue light in the wavelength range of 250 to 500 nm. Useful exposure sources are high or medium pressure halogen mercury vapour lamps, e.g. of 1000 W. Since most lithography is done by the offset process, the imaging element is preferably exposed in such a way that the image obtained thereon is right reading. The exposure may be an exposure using optics or a contact exposure.

The diazo resin or diazonium salts are converted upon exposure from water soluble to water insoluble (due to the destruction of the diazonium groups) and additionally the photolysis products of the diazo may induce an advancement in the level of crosslinking of the polymeric binder or diazo resin, thereby selectively converting the surface, in an image pattern, from water soluble to water insoluble. The unexposed areas remain unchanged, i.e. water soluble.

The following examples illustrate the present invention without being limited thereto. The percentages given are by weight unless otherwise stated.

EXAMPLE

Preparation of the lithographic bases A–E

As lithographic base is considered the support coated with the hydrophilic layer or layers.
Preparation of hydrophilic layer 1

To 440 g of a dispersion contg. 21.5% TiO$_2$ (average particle size 0.3 to 0.5 um) and 2.57% polyvinyl alcohol in deionized water was added 200 g of a hydrolyzed 23% tetramethylorthosilicate emulsion in water.

To this mixture was added 442 g of deionized water and the pH was adjusted to pH=4. In the preparation of lithographic base E 12 g of deionized water was replaced by 12 g of a 10% solution of a wetting agent.
Preparation of hydrophilic layer 2

To 440 g of a dispersion contg. 21.5% TiO$_2$ (average particle size 0.3 to 0.5 um) and 2.57% polyvinyl alcohol in deionized water were subsequently added, while stirring, 250 g of a 5% polyvinyl alcohol solution in water, 105 g of a hydrolyzed 23% tetramethylorthosilicate emulsion in water and 12 g of a 10% solution of a wetting agent.

To this mixture water added 192 g of deionized water and the pH was adjusted to pH=4.

The obtained dispersions were coated as a single layer (hydrophilic bases A and D) or as a coated composition (lithographic bases B, C and D), the hydrophilic layer 2 being the upper layer of such a package, by means of a slide hopper on a polyethyleneterephthalate film support having a thickness of 275 μm (382 g/m$^2$) (coated with a hydrophilic adhesion layer) to a wet coating thickness of 50 μm/m$^2$, dried at 30° C. and subsequently hardened by subjecting it to a temperature of 57° C. for 1 week. The composition of each of the lithographic bases is given in table 2.

TABLE 2

| Hydrophilic base | Hydrophilic layer 1[a,b] | Hydrophilic layer 2[a,b] |
|---|---|---|
| A | — | wet thickness: 50 μm |
|   | — | PVOH: 1,16 g/m$^2$ |
|   | — | SiO$_2$: 0,46 g/m$^2$ |
| B | wet thickness: 10 μm | wet thickness: 40 μm |
|   | PVOH: 0,11 g/m$^2$ | PVOH: 0,93 g/m$^2$ |
|   | SiO$_2$: 0,18 g/m$^2$ | SiO$_2$: 0,37 g/m$^2$ |
| C | wet thickness: 20 μm | wet thickness: 30 μm |
|   | PVOH: 0,22 g/m$^2$ | PVOH: 0,70 g/m$^2$ |
|   | SiO$_2$: 0,36 g/m$^2$ | SiO$_2$: 0,28 g/m$^2$ |
| D | wet thickness: 30 μm | wet thickness: 20 μm |
|   | PVOH: 0,34 g/m$^2$ | PVOH: 0,46 g/m$^2$ |
|   | SiO$_2$: 0,55 g/m$^2$ | SiO$_2$: 0,18 g/m$^2$ |
| E | wet thickness: 50 μm | — |
|   | PVOH: 0,56 g/m$^2$ | — |
|   | SiO$_2$: 0,91 g/m$^2$ | — |

Remarks:
a) PVOH: polyvinyl alcohol
b) SiO$_2$: amount of hydrolyzed tetramethyl orthosilicate, expressed as SiO$_2$ To each of these bases was further provided an aqueous solution of pH=5 of Dormacid (a dextran modified with a diethylaminoehtylgroup available from Pfeifer & Langen) and a cationic wetting agent to a dry coating thickness of 30 mg Dormacid per m$^2$.

The obtained elements were then heated for 1 week at 57° C.

Preparation of the imaging elements AA-EE

The imaging elements were produced by preparing the following light sensitive composition and coating it to the above described corresponding lithographic bases (lithographic base A yields imaging element AA, etc.) in an amount of 35 g/m² (wet coating amount) and drying it at 30° C.

Preparation of the light sensitive coating:

To 63 g of a 20% dispersion of polymethylmethacrylate (particle diameter of 40 nm) stabilized with cetyltrimethylammoniumbromide in deionized water was subsequently added, while stirring, 120 g of a 5% solution of a 98% hydralyzed polyvinyl acetate (POLYVIOL W48/20 available from Wacker) in water and 15 g of a 10% dispersion of heligen blue (BASF) in water. 66 g of a 15% solution of the condensationproduct of diphenylamine diazonium salt and formaldehyde in water was then slowly added. Finally 30 g of a 1.6% solution of cationic fluor containing surfactant (Fluorad FC135 available from 3M) in water, and 726 ml of, water were added.

A first set of imaging elements were then each exposed through a test target to a high pressure halogen mercury vapour lamp of 1000 W at a distance of 70 cm for 90 seconds.

Subsequently the imaging elements were developed by rinsing with plain water and used to print on an offset press running with a commonly employed ink and fountain solution. From the imaging elements AA-DD could be printed 15,000 copies with a good (AA) to excellent (BB, CC and DD) printing result. No printing was possible from the imaging element EE due to an overall fog. The reason therefore is that with said imaging element the light sensitive composition is not longer removable from the lithographic base, even in the unexposed areas of said imaging element because of the low ratio by weight in the hydrophilic layer 1 of polyvinyl alcohol versus hydrolysed tetraalkyl orthosilicate (expressed as silicon dioxide).

Furthermore a strip of imaging element AA, respectively of imaging element BB, CC and DD of 12 cm*19 cm was saturated with water and then brought in contact with a brush with a width of 2.5 cm and subsequently the brush was moved while in contact with said strip over a contact lenght of 20 cm. The test strip underwent 100 consecutive cycli of this operation and was then dried.

Subsequently the number of holes in the lithographic base was counted for each strip of the imaging materials AA, BB, CC and DD. It has been experimentally experienced that said number correlates with the number of printing spots in non-printing areas of a printing plate obtained by imagewise exposing the same imaging element; developing it and using it to print on an offset press running with a commonly employed ink and fountain solution. The results are given in table 3.

TABLE 3

| Imaging Element | Nunmber of holes |
| --- | --- |
| AA | 25 |
| BB | 10 |
| CC | 11 |
| DD | 9 |

Evaluation:

It has been proven that imaging element EE comprising only one hydrophilic layer having a ratio by weight in the hydrophilic layer of polyvinyl alcohol versus hydrolysed tetraalkyl orthosilicate (expressed as silicon dioxide) of 0.62 is not suitable for the preparation of a printing plate because said imaging element can not be processed by plain water.

It is further clear from the results in table 3 that imaging element AA comprising only one hydrophilic layer having a ratio by weight in the hydrophilic layer of polyvinyl alcohol versus hydrolysed tetraalkyl orthosilicate (expressed as silicon dioxide) of 2.5 (comparative element) is more prone to physical damage than the imaging elements BB, CC and DD comprising a package of two hydrophilic layers wherein the top hydrophilic layer has a ratio by weight of polyvinyl alcohol versus hydrolysed tetraalkyl orthosilicate (expressed as silicon dioxide) of 2.5 and the underlying hydrophilic layer of 0.62 (imaging elements according to the invention). The imaging elements BB, CC and DD have the same thickness of the package of hydrophilic layers but differ in the thickness of hydrophilic layer 1 respectively hydrophilic layer 2.

We claim:

1. An imaging element comprising on a support in the order given a coated composition of at least two hydrophilic layers being in water permeable contact with each other and each containing a hydrophilic (co)polymer or (co)polymer mixture and having been hardened with a hydrolysed tetraalkyl orthosilicate and a light sensitive layer containing a diazo resin or a diazonium salt characterized in that the ratio by weight in the top layer of said coated composition of said hydrophilic (co)polymer or (co)polymer mixture versus said hydrolysed tetraalkyl orthosilicate (expressed as silicon dioxide) is at least 1.1 and the ratio by weight in an underlying layer of said coated composition of said hydrophilic (co)polymer or (co)polymer mixture versus said hydrolysed tetraalkyl orthosilicate (expressed as silicon dioxide) is not higher than 0.9.

2. An imaging element according to claim 1 wherein said ratio by weight in the top layer of said coated composition of the hydrophilic (co)polymer or (co)polymer mixture versus the hydrolysed tetraalkyl orthosilicate (expressed as silicon dioxide) is at least 1.5.

3. An imaging element according to claim 1 wherein said ratio by weight in an underlying layer of said coated composition of the hydrophilic (co)polymer or (co)polymer mixture versus the hydrolysed tetraalkyl orthosilicate (expressed as silicon dioxide) is not higher than 0.75.

4. An imaging element according to claim 1 wherein said coated composition of at least two hydrophilic layers comprises hydrophilic (co)polymer or (co)polymer mixture in an amount from 0.2 g/m² to 20 g/m².

5. An imaging element according to claim 1 wherein the ratio of the thickness of said top hydrophilic coated composition of said package to the thickness of said underlying layer of said coated composition varies from 0.1 to 10.

6. An imaging element according to claim 1 wherein the amount of hydrophilic (co)polymer or (co)polymer mixture in said top layer of said coated composition varies from 0.1 g/m² to 18 g/m².

7. An imaging element according to claim 1 wherein the amount of hydrophilic (co)polymer or (co)polymer mixture in said underlying layer of said coated composition varies from 0.01 g/m² to 7.5 g/m².

8. An imaging element according to claim 1 wherein there is provided an intermediate layer containing an organic compound having cationic groups between said coated composition of at least two hydrophilic layers and said light sensitive layer.

9. An imaging element according to claim 1 wherein said light sensitive layer contains a polyvinylacetate hydrolysed to an extent of at least 95% by weight as a hydrophilic binder and further a cationic fluor containing surfactant.

* * * * *